United States Patent
Wang et al.

(10) Patent No.: US 10,002,802 B2
(45) Date of Patent: Jun. 19, 2018

(54) METHOD FOR REDUCING CORE-TO-CORE MISMATCHES IN SOC APPLICATIONS

(71) Applicant: Taiwan Semiconductor Manufacturing Co., Ltd, Hsinchu (TW)

(72) Inventors: Sheng-Tang Wang, Hsinchu (TW); Chia-Ming Chang, Hsinchu (TW); Shih-Che Lin, Toufen Township (TW); Chao-Jui Wang, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/606,098

(22) Filed: May 26, 2017

(65) Prior Publication Data
US 2017/0263509 A1   Sep. 14, 2017

Related U.S. Application Data (62) Division of application No. 14/105,794, filed on Dec. 13, 2013, now Pat. No. 9,666,495.

(51) Int. Cl.
*H01L 21/00*    (2006.01)
*H01L 21/66*    (2006.01)

(52) U.S. Cl.
CPC ............. *H01L 22/20* (2013.01); *H01L 22/12* (2013.01)

(58) Field of Classification Search
CPC .......... H01L 22/12; H01L 22/10; H01L 22/20
See application file for complete search history.

(56) References Cited

U.S. PATENT DOCUMENTS

| 7,555,422 | B2 | 6/2009 | Newman |
| 9,666,495 | B2 * | 5/2017 | Wang ................... H01L 22/20 |
| 2005/0142470 | A1 | 6/2005 | Socha et al. |
| 2007/0212837 | A1 | 9/2007 | Mizuno et al. |
| 2011/0080056 | A1 | 4/2011 | Low |
| 2012/0117520 | A1 | 5/2012 | Kitamura et al. |
| 2012/0216089 | A1 | 8/2012 | Chen et al. |

FOREIGN PATENT DOCUMENTS

| CN | 1965391 A | 5/2007 |
| JP | 2011-191296 A | 9/2011 |
| KR | 1020050062409 | 6/2005 |

OTHER PUBLICATIONS

Korean language Notice of Allowance dated Aug. 23, 2016, issued in application No. KR 10-2014-0180463.
Chinese language office action dated Dec. 28, 2016, issued in application No. CN 201410776548.5.

* cited by examiner

*Primary Examiner* — Seahvosh Nikmanesh
(74) *Attorney, Agent, or Firm* — McClure, Qualey & Rodack, LLP (57) ABSTRACT

Methods for reducing core-to-core mismatch are provided. The method includes measuring gate lengths of a representative pattern of each core in a first lot of SOC products by a measurement apparatus. Each of the SOC products in the first lot includes more than two cores identical to each other. The method also includes determining a tuning amount according to the differences between the gate lengths of each core, and adjusting at least one mask for critical dimensions of gate length of each core in a second lot of SOC products respectively according to the tuning amounts.

20 Claims, 9 Drawing Sheets

METHOD FOR REDUCING CORE-TO-CORE MISMATCHES IN SOC APPLICATIONS

CROSS REFERENCE TO RELATED APPLICATIONS

This Application is a Divisional of U.S. application Ser. No. 14/105,794, filed on Dec. 13, 2013, the entirety of which is incorporated by reference herein.

BACKGROUND

In the course of System-On-Chip (SOC) application, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs. At the same time, the scaling-down process also increases the significance of process-induced inconsistency and environment-induced inconsistency of the components, between their actual sizes of critical dimensions (CDs) as manufactured in a real SOC product and those as designed in an Electronic Design Automation (EAD) tool.

With the development of portable electronic devices (such as smartphones or tablet personal computer), the multi-core SOC products are in a greater demand than the single-core SOC product. However, there are still challenges in reducing core-to-core mismatches in SOC products.

BRIEF DESCRIPTION OF THE DRAWINGS

For a more complete understanding of the embodiments and the advantages thereof, reference is now made to the following descriptions taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE ILLUSTRATIVE EMBODIMENTS

The making and using of the embodiments of the disclosure are discussed in detail below. It is understood that the following disclosure provides many different embodiments, or examples, for implementing different features of the disclosure. Specific examples of components and arrangements are described below to simplify the present disclosure. These are, of course, merely examples and are not intended to be limiting. In accordance with the standard practice in the industry, various features in the drawings are not drawn to scale and are used for illustration purposes only.

A number of novel methods for reducing core-to-core mismatches in SOC applications are provided. Throughout the various views and illustrative embodiments, like reference numbers are used to designate like elements and operations.

Figure 1:
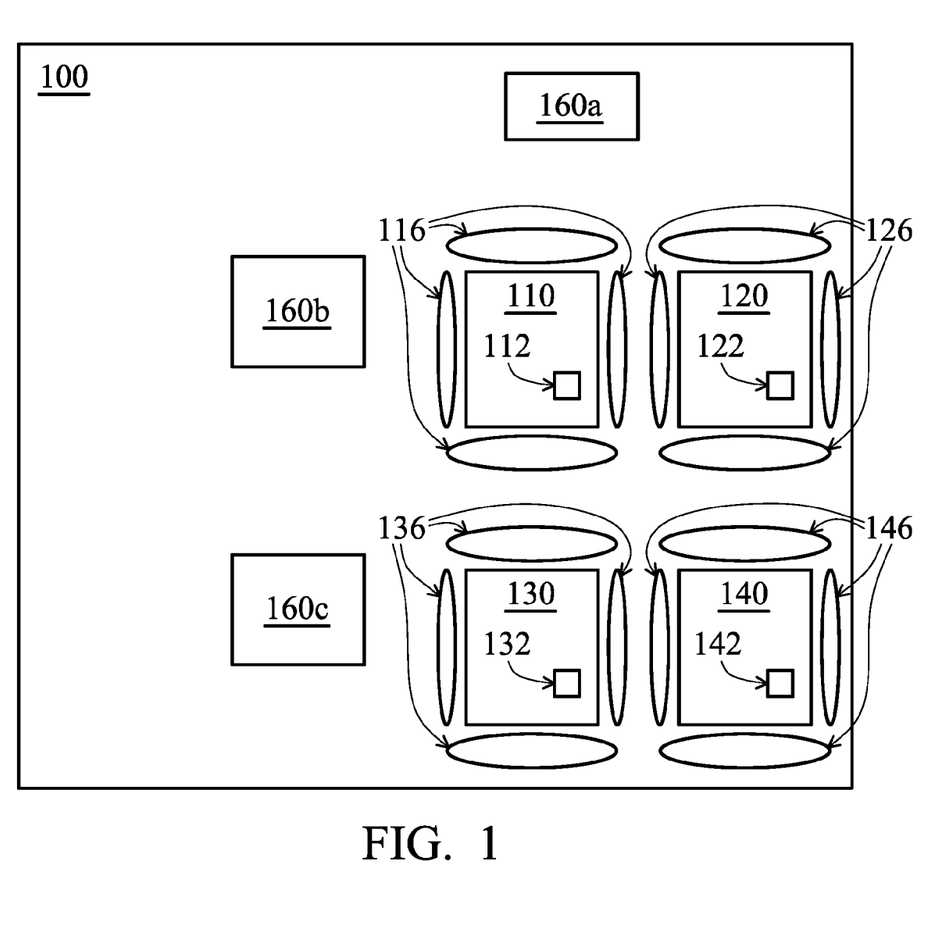
FIG. 1 illustrates a schematic of an SOC product including a number of cores in accordance with some embodiments.

FIG. 1 illustrates a schematic of a first die 100 of an SOC product including a number of cores in accordance with some embodiments. The first die 100 includes four cores 110, 120, 130 and 140, and also includes functional modules 160a, 160b and 160c. Each core 110, 120, 130 and 140 in the first die 100 is identical or mirror identical to each other. For example, the sizes and shapes of the components in the core 110 are the same as the sizes and shapes of the components in the other three cores 120, 130 and 140. However, in the real case, the actual sizes and shapes of the components in the core 110 may not be exactly the same as the sizes and shapes of the components in other three cores 120, 130 and 140 within the first die 100, which will be described later.

In order to measure or test the property or performance of the cores of the first die 100, each core 110, 120, 130 and 140 has a representative pattern 112, 122, 132 or 142 respectively. In some embodiments, the representative pattern is a MOS-like pattern, so that the CDs of gate lengths and/or the electronic characteristics could be measured to evaluate the core-to-core mismatch. Because each core 110, 120, 130 or 140 is identical or mirror identical to each other, their representative patterns 112, 122, 132 and 142 are arranged at the same position within each core 110, 120, 130 or 140 respectively.

Referring again to FIG. 1, each core 110, 120, 130 or 140 has its own surrounding environment 116, 126, 136 and 146 respectively. However, the surrounding environments 116, 126, 136 and 146 may be different due to the arrangements of the cores 110, 120, 130 and 140 and the arrangements of functional modules 160a, 160b and 160c. For example, the functional module 160a is a 4G module, the functional module 160b is a WiFi module, and the functional module 160c is a touch-circuit module. Therefore, the three functional modules 160a, 160b and 160c have different characteristics and functions. As shown in FIG. 1, the core 110 is adjacent to the functional modules 160a and 160b, the core 130 is adjacent to the functional module 160c, and the core 140 is not adjacent to any of the three functional modules 160a, 160b and 160c. Therefore, the surrounding environments 116, 126, 136 and 146 are different from each other, which may result in the core-to-core mismatches of the cores 110, 120, 130 and 140. Such core-to-core mismatches could be observed by measuring an Integrated Circuit Quiescent Current (IDDQ) or an operating speed of each core 110, 120, 130 and 140. Regarding the power consumption and the operation of the portable electronic devices, the core-to-core mismatches of the IDDQ or the operating speed may result in worse performance and a smaller design margin for the portable electronic devices. Therefore, a number of novel methods are provided to reduce core-to-core mismatches in SOC applications.

Figure 2A:
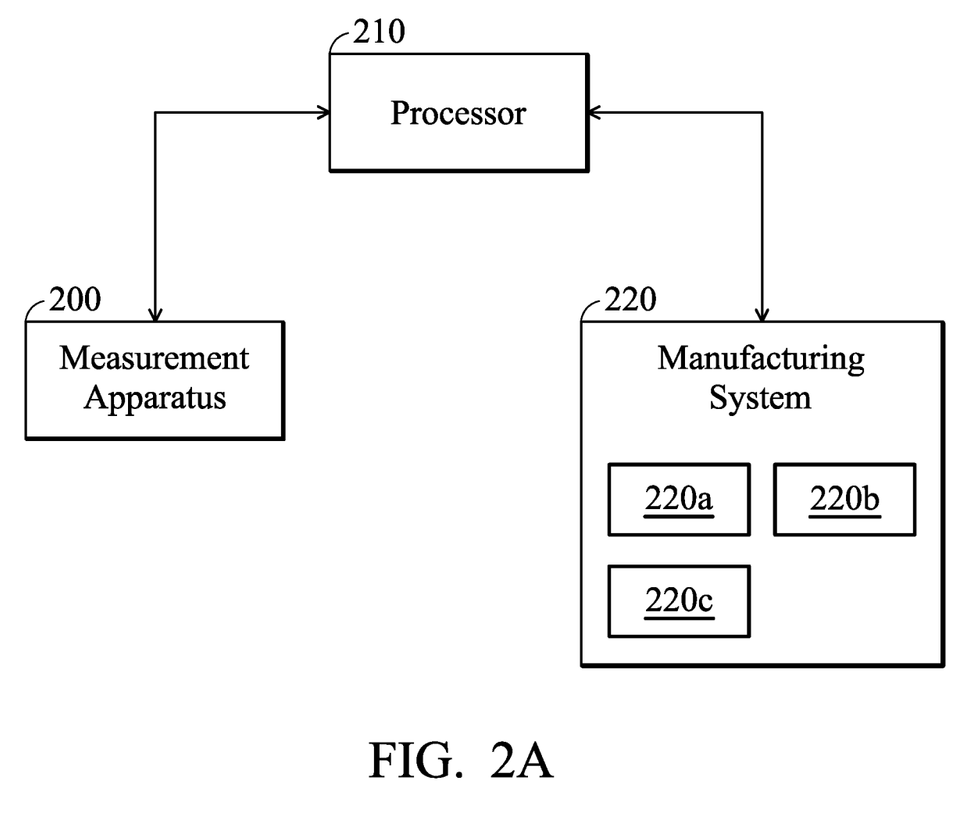
FIG. 2A illustrates a schematic of a number of hardware modules for reducing core-to-core mismatch in accordance with some embodiments.

FIG. 2A illustrates a schematic of a number of hardware modules for reducing core-to-core mismatch in accordance with some embodiments. In some embodiments, a measurement apparatus 200, for example, a circuit probe, is utilized to measure CDs of gate lengths of the representative patterns 112, 122, 132 and 142 of each of the cores 110, 120, 130 and 140 in the first lot. In other embodiments, other measurement apparatuses could be provided to measure other electronic characteristics of the representative patterns 112, 122, 132 and 142. Afterwards, the processor 210 receives the measured data from the measurement apparatus 200, calculates mismatch values, and determines the tuning amount for modulating or adjusting the core-to-core mismatches. For example, the processor could be a central processing unit (CPU), a controller, a multi-processor, a distributed processing system, an application specific integrated circuit (ASIC), and/or a suitable processing unit. In some embodiments, the processor 210 is embedded on a controller or a computer. In other embodiments, the processor 210 controls the manufacturing system 220 to modulate manufacturing conditions or masks for a second lot of SOC products. In should be noted that the manufacturing system 220 may include a number of manufacturing apparatuses 220a, 220b and 220c to implement different manufacturing conditions. For Example, the manufacturing apparatus 220a (i.e. a lithography machine) is utilized to modulate or implement lithography (LIT) energies, the manufacturing apparatus 220b (i.e. an etching machine) is utilized to modulate or implement etching processes, and the manufacturing apparatus 220c (i.e. a thermal anneal machine) is utilized to modulate or implement Rapid Thermal Anneal (RTA) temperatures.

Figure 2B:
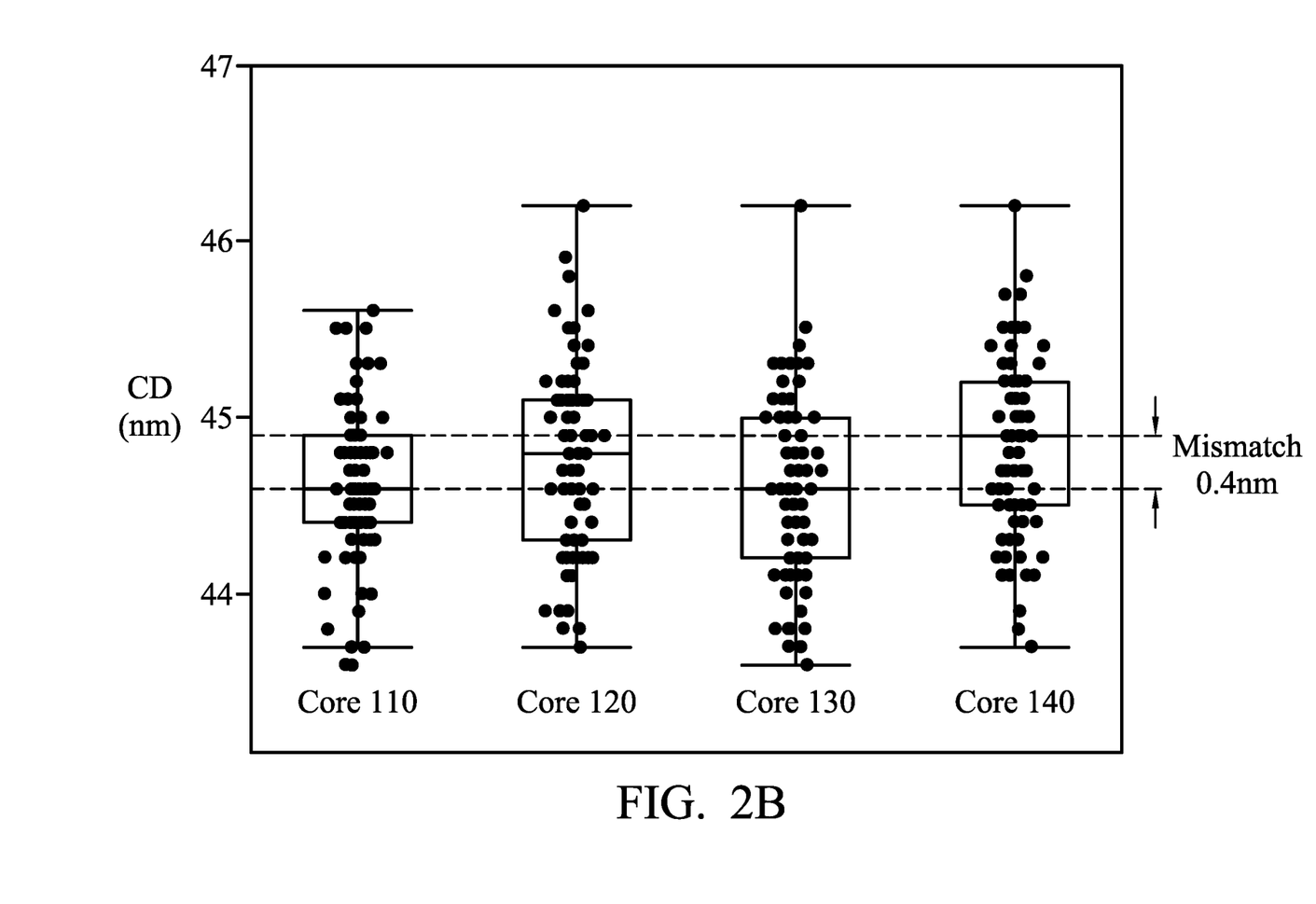
FIG. 2B illustrates a chart of the CD of gate length of a representative pattern of each core in accordance with some embodiments.

FIG. 2B illustrates a chart of the CDs of gate lengths of a representative pattern of each of the cores 110, 120, 130 and 140 in accordance with some embodiments. For example, there may be a plurality of wafers manufactured in a certain lot, which means such wafers are manufactured at the same time and in the same process. In addition, a wafer could include a number of dies, and each die may have multi-core SOC products, which means the SOC product has more than two cores. For example, the first die 100 belongs to a first lot, and the second die belongs to a second lot, which means the two dies are not manufactured at the same time or in the same process. For another example, the first die 100 and the second die both belong to the first lot which means the two dies are manufactured at the same time and in the same process. In one embodiment, the SOC product has four cores 110, 120, 130 and 140, and the wafer of the first lot contains about fifty dies. Now referring to FIG. 2B, because the wafer of the first lot contains fifty dies, there are fifty data of CDs of gate lengths for each core 110, 120, 130 and 140. After receiving the measured data of CDs of gate lengths from the measurement apparatus 200, a processor 210 calculates the median of the fifty data of CDs of gate lengths for each core 110, 120, 130 and 140 respectively.

Referring again to FIG. 2B, the median of CDs of gate lengths for core 110 is 44.5 nm, the median of CDs of gate lengths for core 120 is 44.8 nm, the median of CDs of gate lengths for core 130 is 44.5 nm, and the median of CDs of gate lengths for core 140 is 44.9 nm. Therefore, a number of differences (i.e. mismatch values) between any two medians of different cores could be obtained. In some embodiments, the processor 210 calculates the differences and selects the maximum of the differences to be the tuning amount for modulating or adjusting the core-to-core mismatches. Take FIG. 2B as an example, the highest median is 44.9 nm from core 140 and the lowest median is 44.5 nm from core 110 or 130, therefore, the maximum of the differences is 0.4 nm. Afterwards, the processor 210 selects or determines the maximum difference of 0.4 nm as the tuning amount. Specifically, the mask is adjusted or modulated with a mask logic operation by the processor 210. In some embodiments, the tuning amount of the four cores 110, 120, 130 and 140 is 0.4 nm, the layouts of the cores 110 and 130 are adjusted or modulated so that the CDs of gate lengths of the cores 110 and 130 are decreased by 0.4 nm, and the CDs of gate lengths of the cores 120 and 140 are not changed.

Figure 2C:
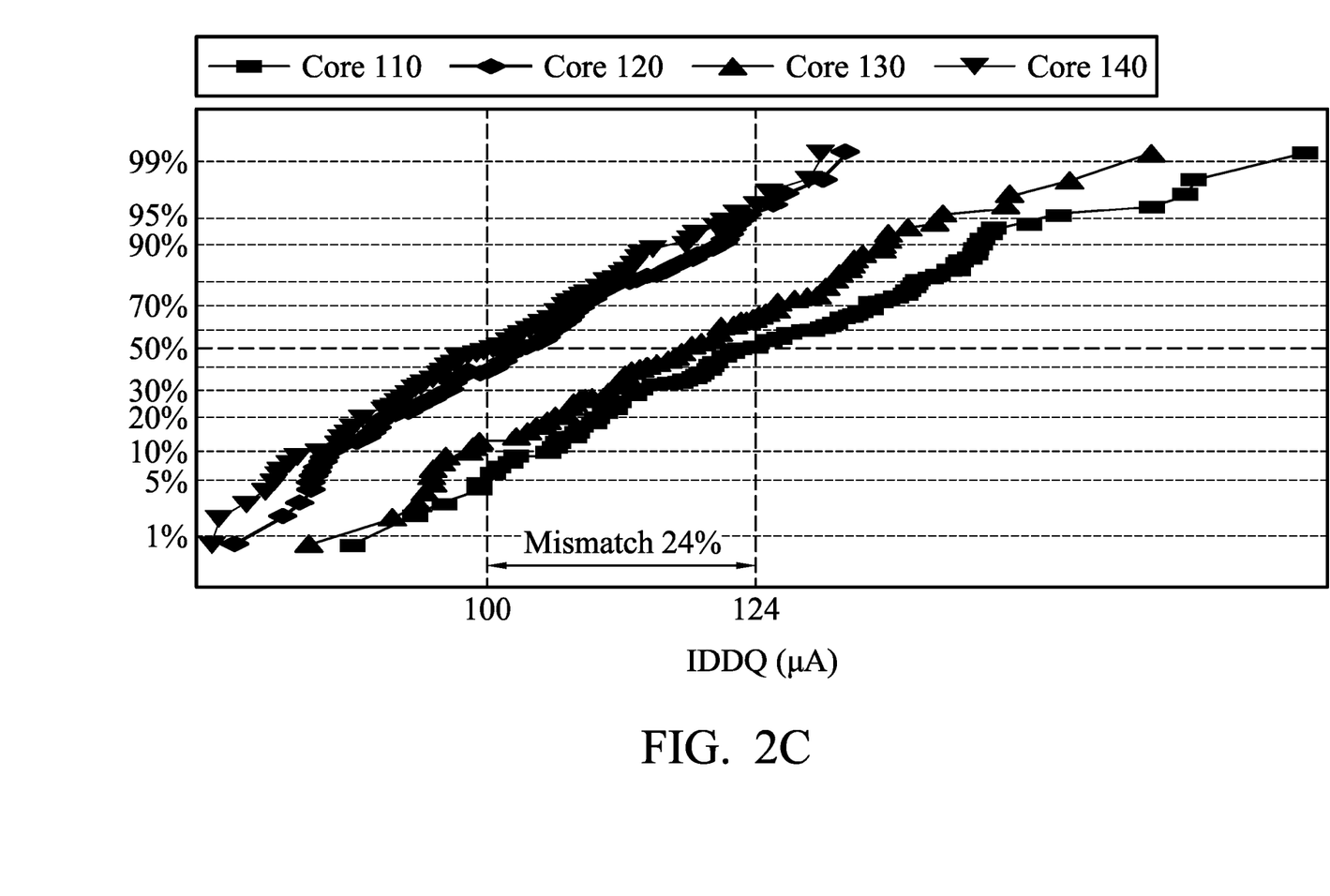
FIG. 2C illustrates a chart of the IDDQ of a representative pattern of each core in accordance with some embodiments.

FIG. 2C illustrates a chart of the IDDQ of a representative pattern of each of the cores 110, 120, 130 and 140 in accordance with some embodiments. Some electronic characteristics of the representative patterns 112, 122, 132 and 142 of each core 110, 120, 130 and 140 in the first lot are measured by another measurement apparatus. In some embodiments, the electronic characteristics include an IDDQ or an operating speed of each core. Because the wafer of the first lot contains fifty dies, there are fifty data of IDDQs for each core 110, 120, 130 and 140. After receiving the measured data of IDDQs from the measurement apparatus 200, the processor 210 calculates the median of the fifty data of IDDQs for the four cores 110, 120, 130 and 140 respectively.

Afterwards, the processor 210 calculates the differences and selects the maximum of the differences to be the tuning amount. The manufacturing system 220 receives the tuning amount from the processor 210 and adjusts the core-to-core mismatches based on the tuning amount. Referring again to FIG. 2B and FIG. 2C, because the IDDQ is inversely proportional to the gate length, the medians of IDDQs from cores 110 and 130 are greater than the medians of IDDQs from cores 120 and 140, while the medians of gate lengths from cores 110 and 130 are smaller than the medians of gate lengths from cores 120 and 140. Specifically, the highest median is 124 µA from core 110, and the lowest median is 100 µA from core 140, so the maximum of the differences is 24 µA and the mismatch proportion is 24%, which is obtained by the difference between the highest median and the lowest median divided by the lowest median. Therefore, the processor 210 selects or determines the maximum difference of 24 µA or the proportion of 124% as the tuning amount.

FIG. 3A to 3E illustrate a number of operation methods for reducing core-to-core mismatch in accordance with some embodiments. Regarding FIG. 3A, in the operation S300, electronic characteristics of a representative pattern of each core 110, 120, 130 and 140 in a first lot of SOC products are measured by a measurement apparatus 200. It should be noted that each of the SOC products in the first lot includes more than two cores identical to each other, and the electronic characteristics include an IDDQ or an operating speed of each core. Afterwards, in the operation S302, the gate lengths of the representative pattern of each core 110, 120, 130 and 140 in the first lot of SOC products are measured by another measurement apparatus. In some embodiments, the operation S302 is implemented before the operation S300. In other embodiments, the operation S302 is implemented without the implementation of the operation S300. In other embodiments, the operation S300 is implemented without the implementation of the operation S302.

Figure 3A:
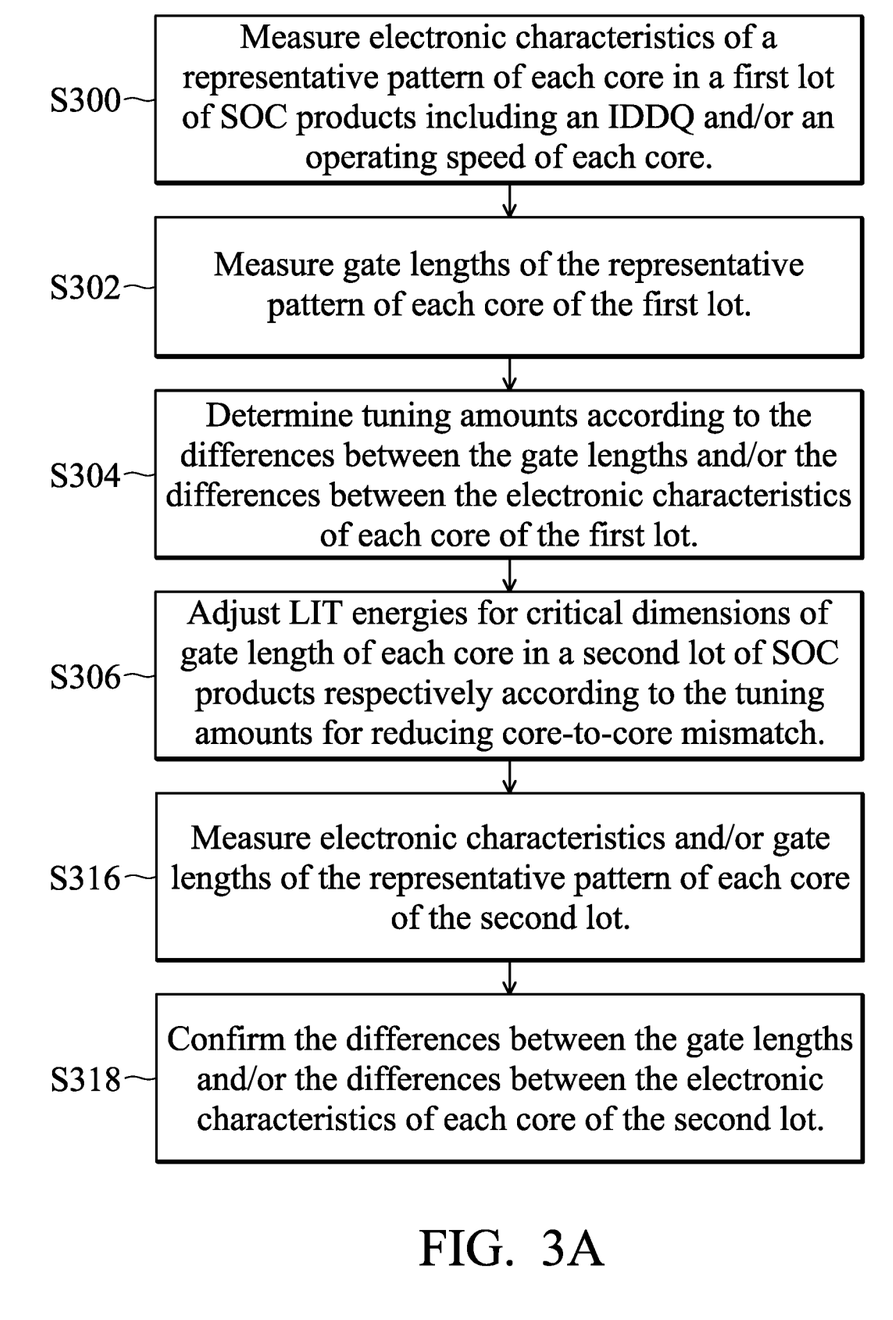
FIGS. 3A to 3E illustrate a number of operation methods for reducing core-to-core mismatch in accordance with some embodiments.

After the operations S300 and/or S302, the method goes to the operation S304. In operation S304, a processor 210 determines the tuning amounts according to the differences between the gate lengths and/or the differences between the electronic characteristics of each core 110, 120, 130 and 140 in the first lot of SOC products. Afterwards, in some embodiments, the processor 210 adjusts or modulates lithography (LIT) energies for CDs of gate lengths of each core 110, 120, 130 and 140 in a second lot of SOC products respectively according to the tuning amounts for reducing core-to-core mismatch due to the surrounding environment of each core 110, 120, 130 and 140, which is described in the operation S306. It should be noted that each of the SOC products in the second lot includes more than two cores identical to each other and also identical to the cores in the first lot.

Regarding to the operation S306, the sensitivity of the LIT energy is about 0.9 nm/mJ to 1.3 nm/mJ. In some embodiments, the CD of gate length will be decreased by 0.9 nm to 1.3 nm with the increase of the LIT energy by 1 mJ while utilizing a first type of photoresist. In other embodiments, the CD of gate length will be increased by 0.9 nm to 1.3 nm with the increase of the LIT energy by 1 mJ while utilizing a second type of photoresist, and the second type of photoresist is opposite to the first type of photoresist. Therefore, by tuning the LIT energy based on the tuning amount, the CD of gate length could be adjusted or operated.

In some embodiments, the operation S316 is implemented after the operation S306. In the operation S316, electronic characteristics and/or CDs of gate lengths of the representative pattern of each core 110, 120, 130 and 140 in the second lot of SOC products by measurement apparatuses. After the operation S316, the differences between the CDs of gate lengths and/or the differences between the electronic characteristics of each core in the second lot of SOC product are confirmed, which is described in the operation S318.

Figure 3B:
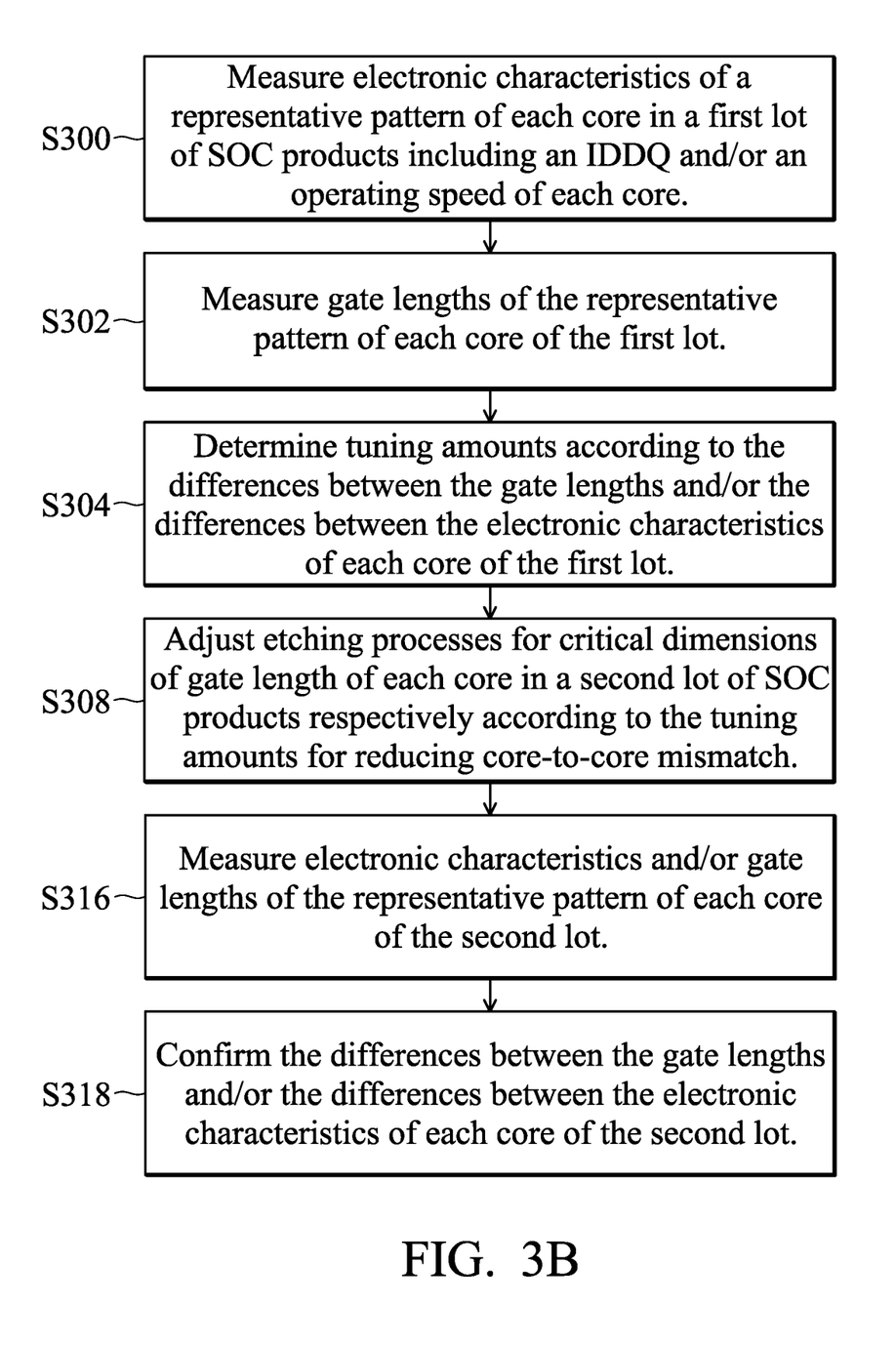
Figure 3C:
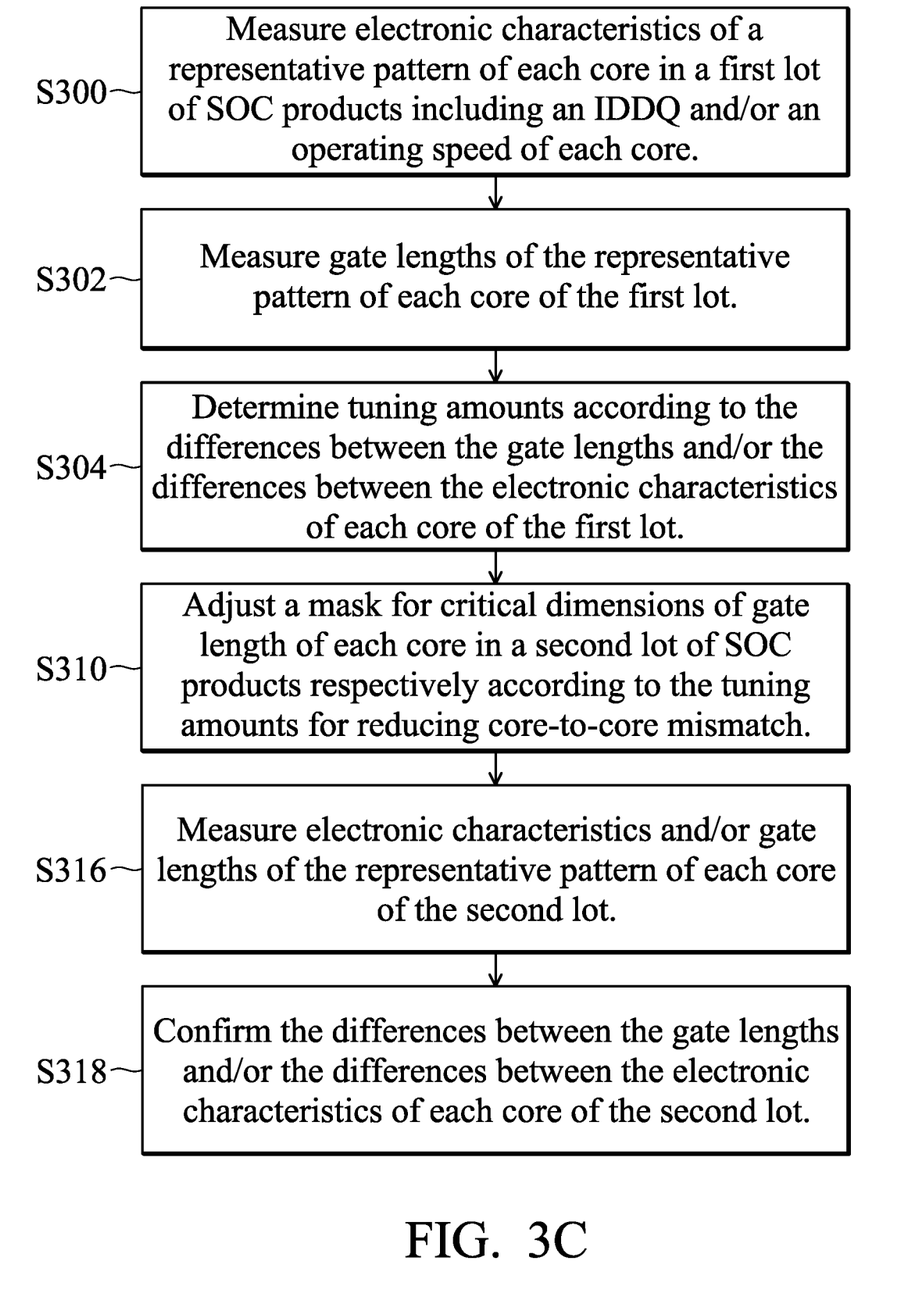

FIG. 3B illustrates another operation method for reducing core-to-core mismatch in accordance with some embodiments. In some embodiments, the operation S308 is implemented after the operation S304. In the operation S308, the processor adjusts or modulates etching processes for critical dimensions of CDs of gate lengths in a second lot of SOC products respectively according to the tuning amounts for reducing core-to-core mismatch due to the surrounding environment of each core 110, 120, 130 and 140. The etching processes for adjusting gate lengths in different regions of the second lot of SOC products are respectively implemented according to the tuning amounts. FIG. 3C illustrates another operation method for reducing core-to-core mismatch in accordance with some embodiments. In other embodiments, the operation S310 is implemented after the operation S304. In the operation S310, the processor adjusts or modulates at least one mask for critical dimensions of CDs of gate lengths in a second lot of SOC products respectively according to the tuning amounts for reducing core-to-core mismatch due to the surrounding environment of each core 110, 120, 130 and 140.

In some embodiments, the operations S306 and S308 could both be implemented after the operation S304. In other embodiments, the operations S310 and one of the operations of S306 or S308 could both be implemented after the operation S304. In other embodiments, the operations S310 and the operations of S306 and S308 could all be implemented after the operation S304. It should be noted that in some embodiments, the operations S306 and/or S308 and/or S310 will be implemented when the tuning amount is greater than a pre-determined offset value of the CD of gate length or the electronic characteristic. Specifically, the pre-determined offset value of the CD of gate length is about 0.1 nm to 0.6 nm, and the pre-determined offset value of the electronic characteristic is the mismatch proportion of 10% to 30%.

Figure 3D:
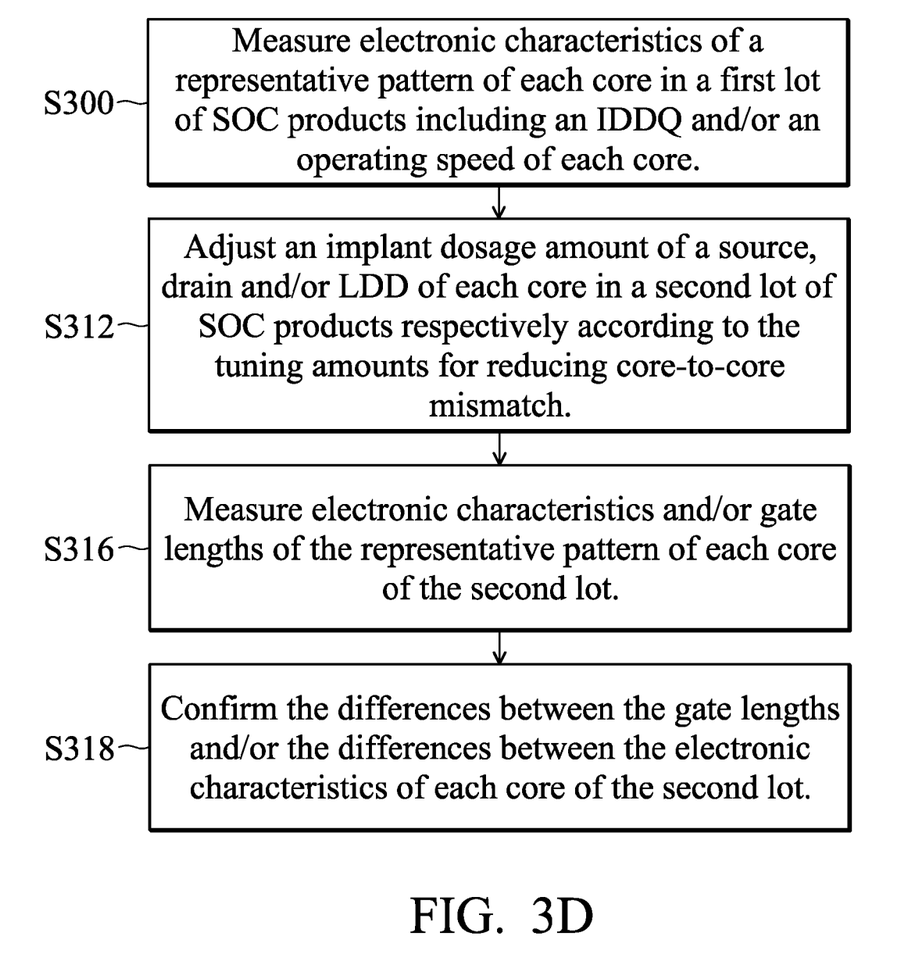
Figure 3E:
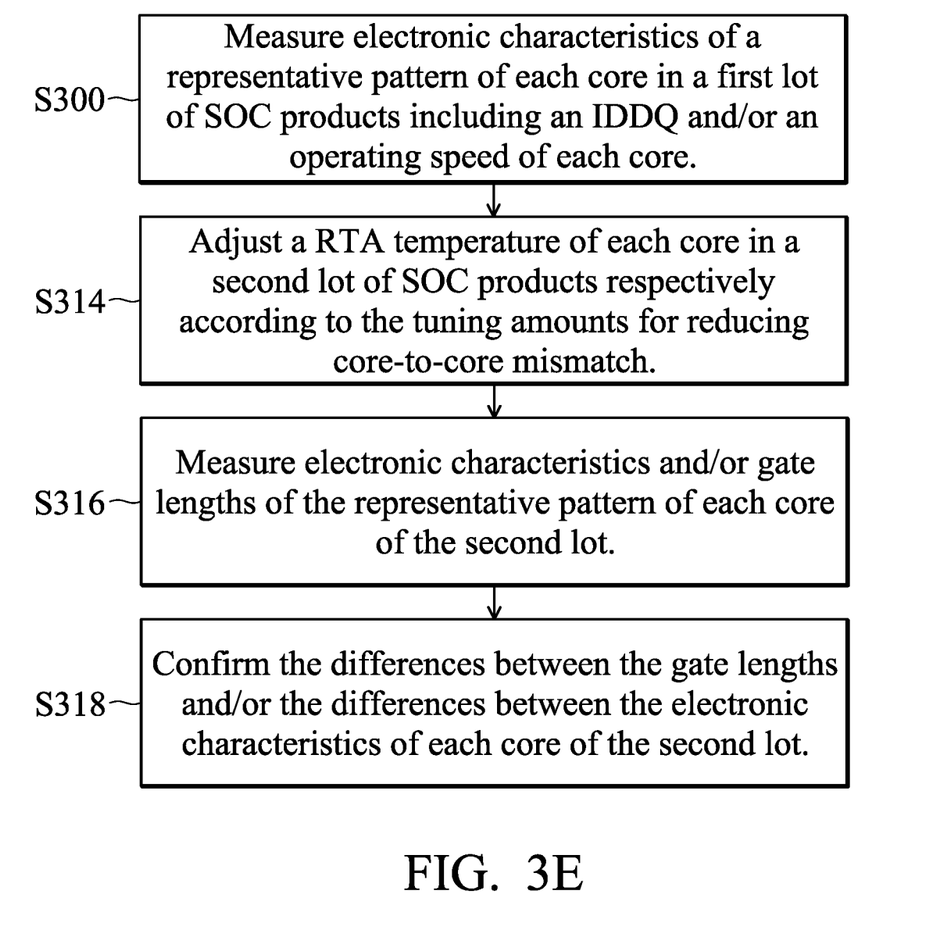

FIG. 3D illustrates another operation method for reducing core-to-core mismatch in accordance with some embodiments. In some embodiments, the operation S312 is implemented after the operation S300. In operation S312, the processor adjust or modulates a source, drain and/or Lightly Doped Drain (LDD) implant dosage amount of each individual core in a second lot of SOC products respectively according to the tuning amounts for reducing core-to-core mismatch due to the surrounding environment of each core. In one embodiment, the implant dosage amounts of the source, drain and/or LDD of each core in different regions of the second lot are respectively implemented according to the tuning amounts. For example, the implant dosage amounts of the source and drain of cores 110 and 130 are decreased, and the implant dosage amounts of the source and drain of cores 120 and 140 are increased. Therefore, the tuning of the implant dosage amount is implemented by core to improve the core-to-core mismatch. FIG. 3E illustrates another operation method for reducing core-to-core mismatch in accordance with some embodiments. In other embodiments, the operation S314 is implemented after the operation S300. In operation S314, the processor adjusts or modulates a Rapid Thermal Anneal (RTA) temperature of each individual core in a second lot of SOC products respectively according to the tuning amounts for reducing core-to-core mismatch due to the surrounding environment of each core. In one embodiment, the RTA temperature of each core in different regions of the second lot are respectively implemented according to the tuning amounts for activating the implant dosage, so that the RTA temperature is implemented by core to improve the core-to-core mismatch. In other embodiments, the operations S312 and/or S314 will be implemented when the tuning amount is greater than a pre-determined offset value of the electronic characteristic.

Exemplary mismatch values of the IDDQ and CD of gate length are shown on TABLE 1 as follows:

TABLE 1

| Mismatch Value | Without Modulation Method | With Modulation Method |
|---|---|---|
| IDDQ (%) | 24% | 5% |
| CD of gate length (nm) | 0.4 nm | 0.15 nm |
| CD of gate length (%) | 0.90% | 0.34% |

By utilizing the modulation method provided by the present disclosure, the mismatch of the CDs of gate lengths is decreased from 0.4 nm (with a normalized value of 0.90%) to 0.15 nm (with a normalized value of 0.34%), and the mismatch of the IDDQ is decreased from 24% to 5%. The mismatch is caused by the different surrounding environments of each core 110, 120, 130 and 140 within a die. Therefore, the core-to-core mismatch should be reduced or improved by modulating or adjusting each core 110, 120, 130 and 140 individually. The present disclosure provides a method to modulate or adjust the manufacturing condition and/or the mask of each core 110, 120, 130 and 140 of the second lot of SOC products based on the tuning amount obtained from the first lot of SOC products. Specifically, the modulations or adjustments of the manufacturing condition and/or the mask could be implemented by each individual core respectively rather than by die or wafer. Therefore, such modulations or adjustments can reduce the core-to-core mismatch due to the different surrounding environments of each die, so that the multi-core SOC products could have a better performance and a greater design margin.

In accordance with some embodiments of the present disclosure, a method for reducing core-to-core mismatch is provided. The method includes measuring gate lengths of a representative pattern of each core in a first lot of SOC products by a measurement apparatus. Each of the SOC products in the first lot includes more than two cores that are identical to each other. The method also includes determining a tuning amount according to the differences between the gate lengths of each core, and adjusting manufacturing conditions for critical dimensions of gate length of each core in a second lot of SOC products respectively according to the tuning amounts for reducing core-to-core mismatch due to the surrounding environment of each core. Each of the SOC products in the second lot includes more than two cores identical to each other and also identical to the cores in the first lot.

In accordance with other embodiments, a method for reducing core-to-core mismatch is provided. The method includes measuring gate lengths of a representative pattern of each core in a first lot of SOC products by a measurement apparatus. Each of the SOC products in the first lot includes more than two cores identical to each other. The method also includes determining a tuning amount according to the differences between the gate lengths of each core, and adjusting a mask for critical dimensions of the gate length of each core in a second lot of SOC products respectively according to the tuning amounts for reducing core-to-core mismatch due to the surrounding environment of each core. Each of the SOC products in the second lot includes more than two cores identical to each other and also identical to the core in the first lot.

In accordance with other embodiments, a method for reducing core-to-core mismatch is provided. The method includes measuring electronic characteristics of a representative pattern of each core in a first lot of SOC products by a measurement apparatus. Each of the SOC products in the first lot includes more than two cores identical to each other. The method also includes adjusting manufacturing conditions of each core in a second lot of SOC products respectively according to the measured electronic characteristics for reducing core-to-core mismatch due to the surrounding environment of each core. Each of the SOC products in the second lot includes more than two cores identical to each other and also identical to the core in the first lot.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and modulations described in the specification. As one of ordinary skill in the art will readily appreciate from the disclosure, processes, machines, manufacture, compositions of matter, means, methods, or modulations, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or modulations. In addition, each claim constitutes a separate embodiment, and the combination of various claims and embodiments are within the scope of the disclosure.

What is claimed is:

1. A method for reducing core-to-core mismatch, comprising:
    measuring gate lengths of a representative pattern of each core in a first lot of system-on-chip (SOC) products by a measurement apparatus, wherein each of the SOC products in the first lot includes more than two cores identical to each other;
    determining a tuning amount according to the differences between the gate lengths of each core in the first lot of SOC products; and
    adjusting at least one mask for critical dimensions of gate length of each core in a second lot of SOC products respectively according to the tuning amounts determined by the differences between the gate lengths of each core in the first lot of SOC products.

2. The method for reducing core-to-core mismatch of claim 1, wherein when the tuning amount is greater than a pre-determined offset value of gate length critical dimensions (CDs), the adjustment of manufacturing conditions is implemented, wherein the tuning amount is a maximum of the differences between the gate lengths of each core.

3. The method for reducing core-to-core mismatch of claim 1, further comprising measuring electronic characteristics of the representative pattern of each core.

4. The method for reducing core-to-core mismatch of claim 3, wherein the electronic characteristics include an Integrated Circuit Quiescent Current (IDDQ) or an operating speed of each core.

5. The method for reducing core-to-core mismatch of claim 4, wherein when the tuning amount is greater than a pre-determined offset value of the IDDQ, the adjustment of manufacturing conditions is implemented, wherein the tuning amount is a maximum of differences between the IDDQs of each core.

6. The method for reducing core-to-core mismatch of claim 1, wherein the representative pattern is a MOS-like pattern.

7. The method for reducing core-to-core mismatch of claim 1, wherein each of the SOC products in the second lot includes more than two cores identical to each other and also identical to the core in the first lot.

8. A method for reducing core-to-core mismatch, comprising:
    measuring gate lengths of a representative pattern of each core in a first lot of SOC products by a measurement apparatus;
    determining a tuning amount according to the differences between the gate lengths of each core, wherein the tuning amount is a maximum of the differences between the gate lengths of each core in the first lot of SOC products; and
    adjusting at least one mask for critical dimensions of gate length of each core in a second lot of SOC products respectively according to the tuning amounts determined by the differences between the gate lengths of each core in the first lot of SOC products.

9. The method for reducing core-to-core mismatch of claim 8, wherein when the tuning amount is greater than a pre-determined offset value of gate length CDs, the adjustment of manufacturing conditions is implemented, and each of the SOC products in the first lot includes more than two cores identical to each other.

10. The method for reducing core-to-core mismatch of claim 8, further comprising measuring electronic characteristics of the representative pattern of each core.

11. The method for reducing core-to-core mismatch of claim 10, wherein the electronic characteristics include an IDDQ or an operating speed of each core.

12. The method for reducing core-to-core mismatch of claim 11, wherein when the tuning amount is greater than a pre-determined offset value of the IDDQ, the adjustment of manufacturing conditions is implemented, wherein the tuning amount is a maximum of differences between the IDDQs of each core.

13. The method for reducing core-to-core mismatch of claim 8, wherein the representative pattern is a MOS-like pattern.

14. The method for reducing core-to-core mismatch of claim 8, wherein each of the SOC products in the second lot includes more than two cores identical to each other and also identical to the core in the first lot.

15. The method for reducing core-to-core mismatch of claim 1, wherein the representative pattern of each core is arranged at the same position within the each core respectively.

16. The method for reducing core-to-core mismatch of claim 4, further comprising calculating a median of the gate lengths for each core.

17. The method for reducing core-to-core mismatch of claim 16, further comprising determining differences between the gate lengths of each core based on the median.

18. The method for reducing core-to-core mismatch of claim 8, wherein the representative pattern of each core is arranged at the same position within the each core respectively.

19. The method for reducing core-to-core mismatch of claim 11, further comprising calculating a median of the gate lengths for each core.

20. The method for reducing core-to-core mismatch of claim 19, further comprising determining differences between the gate lengths of each core based on the median.

\* \* \* \* \*